United States Patent
Anglin et al.

(10) Patent No.: US 11,640,909 B2
(45) Date of Patent: May 2, 2023

(54) TECHNIQUES AND APPARATUS FOR UNIDIRECTIONAL HOLE ELONGATION USING ANGLED ION BEAMS

(71) Applicant: APPLIED Materials, Inc., Santa Clara, CA (US)

(72) Inventors: Kevin Anglin, Somerville, MA (US); Simon Ruffell, South Hamilton, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 535 days.

(21) Appl. No.: 16/676,857

(22) Filed: Nov. 7, 2019

(65) Prior Publication Data

US 2020/0194271 A1    Jun. 18, 2020

Related U.S. Application Data

(60) Provisional application No. 62/779,757, filed on Dec. 14, 2018.

(51) Int. Cl.
*H01L 21/3065* (2006.01)
*H01L 21/02* (2006.01)
(Continued)

(52) U.S. Cl.
CPC .... *H01L 21/3065* (2013.01); *H01J 37/32623* (2013.01); *H01J 37/32899* (2013.01);
(Continued)

(58) Field of Classification Search
CPC ............. H01L 21/3065; H01L 21/3085; H01L 21/3086; H01L 21/0337; H01L 21/78616
See application file for complete search history.

(56) References Cited

U.S. PATENT DOCUMENTS

| 9,589,811 B2 | 3/2017 | Ruffell |
| 2007/0026321 A1 | 2/2007 | Kumar |

(Continued)

FOREIGN PATENT DOCUMENTS

| JP | 2000-150479 A | 5/2000 |
| JP | 2015529744 A | 10/2015 |

(Continued)

OTHER PUBLICATIONS

International Search Report for the International Patent Application No. PCT/US2019/064689, dated Mar. 23, 2020, 11 pages.

*Primary Examiner* — Alia Sabur
(74) *Attorney, Agent, or Firm* — KDW Firm PLLC (57) ABSTRACT

A method of patterning a substrate. The method may include providing a cavity in a layer, disposed on the substrate, the cavity having a first length along a first direction and a first width along a second direction, perpendicular to the first direction, and wherein the layer has a first height along a third direction, perpendicular to the first direction and the second direction. The method may include depositing a sacrificial layer over the cavity in a first deposition procedure; and directing angled ions to the cavity in a first exposure, wherein the cavity is etched, and wherein after the first exposure, the cavity has a second length along the first direction, greater than the first length, and wherein the cavity has a second width along the second direction, no greater than the first width.

16 Claims, 7 Drawing Sheets

(51) Int. Cl.
    *H01L 21/311* (2006.01)
    *H01J 37/32* (2006.01)
    *H01L 21/67* (2006.01)

(52) U.S. Cl.
    CPC .......... *H01L 21/02118* (2013.01); *H01L 21/31116* (2013.01); *H01L 21/67069* (2013.01); *H01L 21/67167* (2013.01); *H01L 21/67196* (2013.01); *H01L 21/67201* (2013.01); *H01L 21/67207* (2013.01); *H01L 21/67213* (2013.01); *H01J 2237/0451* (2013.01); *H01J 2237/332* (2013.01); *H01J 2237/3341* (2013.01)

(56) References Cited

U.S. PATENT DOCUMENTS

| | | |
|---|---|---|
| 2014/0034611 A1 | 2/2014 | Godet et al. |
| 2015/0083581 A1 | 3/2015 | Sherman et al. |
| 2015/0311073 A1 | 10/2015 | Srinivasan et al. |
| 2016/0005594 A1 | 1/2016 | Omstead et al. |
| 2016/0268162 A1 | 9/2016 | Akasaka et al. |
| 2016/0379816 A1 | 12/2016 | Ruffel et al. |
| 2017/0042010 A1 | 2/2017 | Liang et al. |
| 2017/0263460 A1* | 9/2017 | Ruffell ............... H01L 21/3085 |
| 2018/0076007 A1 | 3/2018 | Gilchrist et al. |
| 2019/0148109 A1* | 5/2019 | Yun ............... H01J 37/32816 156/345.55 |

FOREIGN PATENT DOCUMENTS

| | | |
|---|---|---|
| JP | 2018-521509 A | 8/2018 |
| JP | 2018-523922 A | 8/2018 |

\* cited by examiner

TECHNIQUES AND APPARATUS FOR UNIDIRECTIONAL HOLE ELONGATION USING ANGLED ION BEAMS

FIELD

This application claims priority to U.S. Provisional Patent application Ser. No. 62/779,757, filed Dec. 14, 2018, entitled TECHNIQUES AND APPARATUS FOR UNIDIRECTIONAL HOLE ELONGATION USING ANGLED ION BEAMS, and incorporated by reference herein in its entirety.

FIELD

The present embodiments relate to transistor processing techniques, and more particularly, to etch processing for patterning devices.

BACKGROUND

As semiconductor devices continue to scale to smaller dimensions, the ability to pattern features becomes increasingly difficult.

One particular challenge is to print small features such as cavities, where the cavities are separated by a small distance, on the order of nanometers or tens of nanometers in present day technology. As an example, printing of adjacent linear trenches or holes with the appropriate tip-to-tip distance becomes increasing challenging as overall pitch of device structures continues to shrink. Notably, lithographically printing small cavities at a small pitch may be unreliable due to overlay issues. Said differently, to realize a small separation for small cavities, multiple masks may be needed, where overlay errors between masks may cause overlap of cavities or unduly large separation between cavities.

To generate such patterns in a given layer using a single mask layer, one possible strategy is to pattern a series of cavities lithographically and then etch the cavities to enlarge the cavities. Notably, a drawback of etching a cavity in a given layer is the loss of layer thickness during the etching.

With respect to these and other considerations the present improvements may be useful.

BRIEF SUMMARY

In one embodiment, a method of patterning a substrate is provided. The method may include providing a cavity in a layer, disposed on the substrate, the cavity having a first length along a first direction and a first width along a second direction, perpendicular to the first direction, and wherein the layer has a first height along a third direction, perpendicular to the first direction and the second direction. The method may include depositing a sacrificial layer over the cavity in a first deposition procedure; and directing angled ions to the cavity in a first exposure, wherein the cavity is etched, and wherein after the first exposure, the cavity has a second length along the first direction, greater than the first length, and wherein the cavity has a second width along the second direction, no greater than the first width.

In another embodiment, a method of patterning a substrate may include providing a cavity in a first layer, disposed on the substrate, the cavity having a first length along a first direction and a first width along a second direction, perpendicular to the first direction, and wherein the layer has a first height along a third direction, perpendicular to the first direction and the second direction. The method may include depositing a sacrificial layer over the cavity in a first deposition procedure; and directing angled ions to the cavity in a first exposure. The angled ions may include a first angled ion beam having a first trajectory, directed to a first sidewall of the cavity, and a second angled ion beam having a second trajectory, directed to a second sidewall of the cavity, opposite the first sidewall. As such, the cavity is etched, wherein after the first exposure, the cavity has a second length along the first direction, greater than the first length, and wherein the cavity has a second width along the second direction, no greater than the first width.

In a further embodiment, an apparatus is provided. The apparatus may include a loadlock to receive a substrate, and a transfer chamber, coupled to the loadlock, and arranged to transfer the substrate under vacuum. The apparatus may include an angled ion beam etch station, coupled to the transfer chamber, to direct a reactive angled ion beam to the substrate at a non-zero angle of incidence with respect to a normal to a substrate plane. The apparatus may include a polymer deposition chamber, coupled to the transfer chamber, arranged to deposit a polymer layer on the substrate, and a controller, coupled to the polymer deposition chamber, the transfer chamber and the angled ion beam etch station. The controller may be arranged to cycle the substrate over a plurality of etch cycles, wherein a given etch cycle comprises deposition of the polymer layer in the polymer deposition chamber, etching of the substrate in the angled ion beam etch station, and transporting the substrate between the polymer deposition chamber and the angled ion beam etch station via the transfer chamber.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel techniques and apparatus to pattern substrates and in particular novel techniques to etch a cavity disposed in a substrate, along a designed direction. Such processing may be deemed elongation patterning, where a feature such as a via or trench may be formed having an initial shape and size, and may be subsequently elongated along the designed direction using a series of etch operations. The designed direction may correspond to a horizontal direction within a plane of the substrate. According to various embodiments, the elongation of the feature may take place along the designed direction (first direction) while the cavity is not enlarged or enlarged to a lesser extent along a perpendicular direction to the designed direction (second direction) within the plane of the substrate. In this manner, a cavity may be selectively elongated along just one direction, providing various concomitant advantages for patterning substrates, as disclosed herein.

In particular embodiments, unidirectional cavity elongation within a given layer is accomplished using a novel set of deposition and etching operations. Unidirectional cavity elongation may refer to selective elongation of the dimensions of a cavity (or hole) along a select direction, such as along the Y-axis of a Cartesian coordinate system, where elongation does not take place along orthogonal directions, such as along the X-axis and along the Z-axis. In some embodiments, a cavity may be processed wherein the original thickness (along the Z-direction) of a layer containing the cavity may be preserved, while the cavity is etched within a plane of the layer along just one direction and not the other direction.

In particular embodiments, a cavity is provided in a layer where the cavity has a first length along a first direction. In a first operation involves depositing a sacrificial layer over the cavity in a first deposition procedure, while a second operation involves directing angled ions to the cavity in a first exposure, wherein the cavity is etched. After the first exposure, the cavity may attain second length along the first direction, greater than the first length, wherein the cavity has a second width or final width along the second direction, no greater than the first width. In some instances, the final width is the same as the first width.

FIG. 1A to FIG. 1E depict a side view of various stages of processing of a substrate, in accordance with embodiments of the disclosure. FIG. 1F to FIG. 1J depict a top view of the stages of corresponding to respective FIGS. 1A to 1C.

Turning to FIGS. 1A-1E, there is shown a series of instances during implementation of a substrate pattern in a substrate 100, according to some embodiments of the disclosure. According to various embodiments, a combination of a deposition operation and an etch operation are performed in a sequential manner. By way of background, the substrate 100 may include an array of features where just one feature, shown as cavity 110, is depicted in the figures. For example, the lateral dimension of the features may be on the order of 30 nm, 20 nm, 10 nm, 5 nm, or 3 nm in some cases, while the design separation between features may have similar values. To accurately generate such features, a novel combination of deposition and etching operations is provided to selectively change the size of a feature, such as a trench or via. In particular, a trench or via may be selectively elongated along a targeted direction to generate a designed shape and size for the trench or via, while also adjusting the separation between trenches to achieve a designed separation. At the same time, the layer thickness of a layer containing the feature may be preserved, while unwanted enlargement of the feature in a direction orthogonal to the targeted direction is avoided.

Figure 1A:
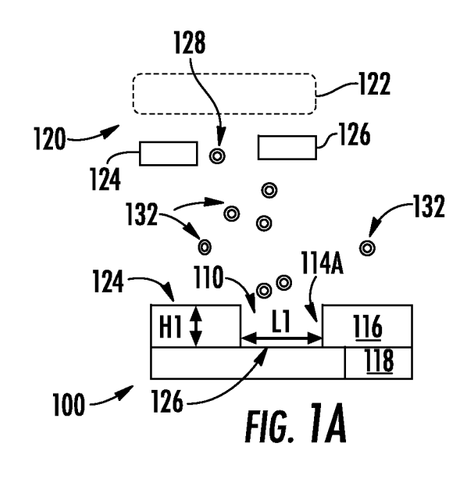
FIG. 1A to FIG. 1E depict a side view of various stages of processing of a substrate, in accordance with embodiments of the disclosure.
Figure 1B:
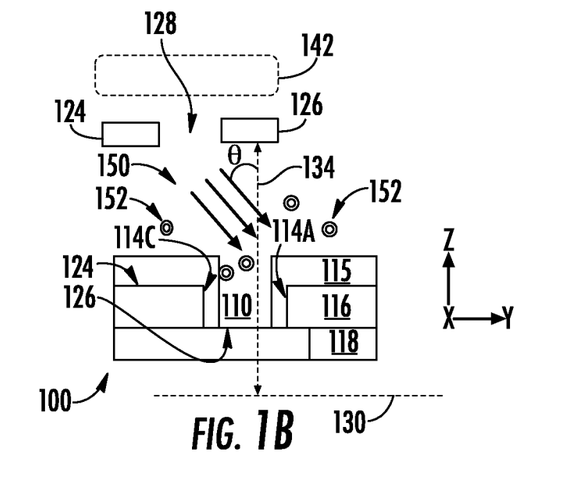
Figures 1C, 1D:
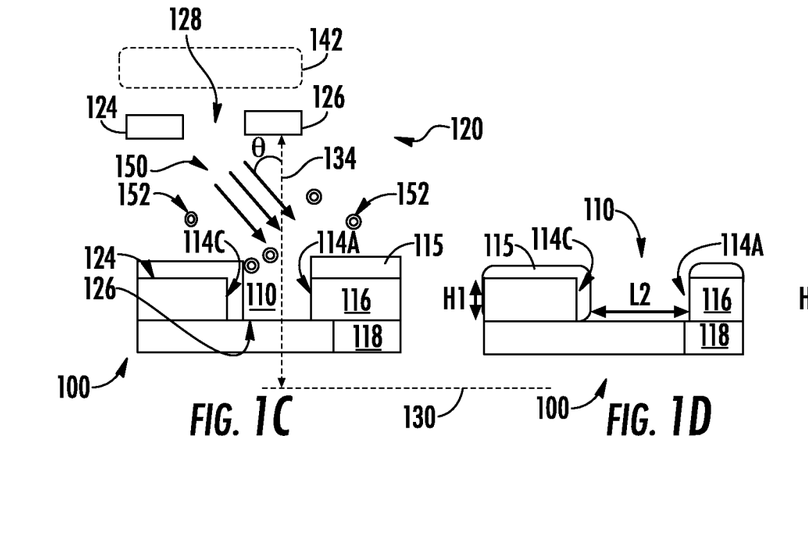
Figure 1E:
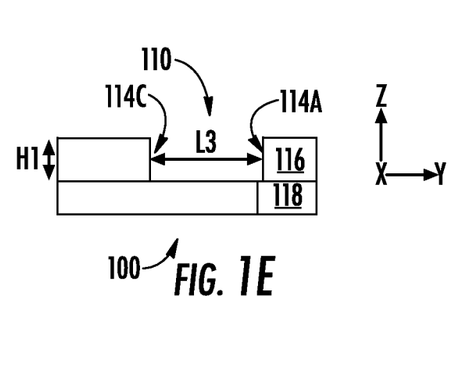
Figure 1F:
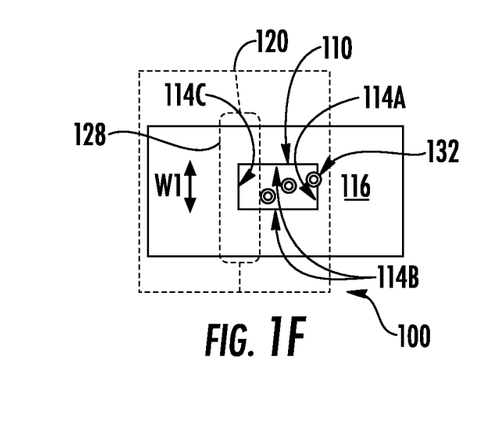
FIG. 1F to FIG. 1J depict a top view of the stages of corresponding to respective FIGS. 1A to 1E.

In FIG. 1A and FIG. 1F, an extraction system 120 is shown, to direct depositing species, as well as etching species to the substrate 100. The extraction system 120 may be implemented in a plasma-based tool in some embodiments. In other embodiments, the extraction system 120 may be omitted. As shown in FIG. 1A, a plasma 122 is generated. The plasma 122 may generate depositing species to deposit a polymer-type film in some embodiments, Gaseous species such as $CH_3F$ or $CH_4$ or other known polymer forming chemical species may be provided, reacted in the plasma 122, exiting the extraction system 120 through extraction aperture 128. These species may form reactive depositing species 132, which species impinge upon the substrate 100. In this example, the cavity 110 is formed in a layer 116, where the layer 116 may be a hard mask layer, a soft mask layer, or a device layer, to be preserved. As such, the cavity 110 may be defined by dimensions along different directions, including L1 along the Y-axis, H1 along the Z-axis, and W1 along the X-axis of the Cartesian coordinate system shown. The reactive depositing species may deposit on the layer 116 including on sidewall 114A, sidewall 114C and sidewalls 114B of the cavity 110, as shown in FIG. 1A and FIG. 1F. In some embodiments, the substrate 100 may be biased negatively with respect to the plasma 122, such as at −200 V, −100 V, −50 V, or −20 V. The embodiments are not limited in this context. As such, a polymeric layer may tend to deposit on the substrate 100, forming the sacrificial layer 115, shown in FIG. 1B and FIG. 1G. The deposition process advantageously may deposit a thicker polymer at the top horizontal surfaces than on the vertical surfaces (sidewalls) or down into the cavity 110, due to the higher solid angle for the flux of radical and neutral species (represented by reactive depositing species 132) coming from the plasma 122.

Figure 1G:
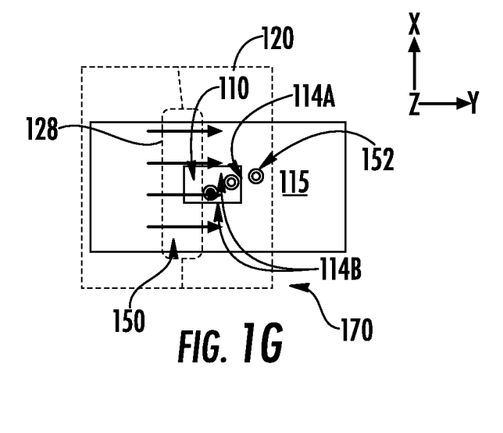

Continuing with FIG. 1B and FIG. 1G, a directional reactive ion etch operation is performed after the completion of the deposition of the sacrificial layer 115, to elongate the cavity along the Y-axis. At the stage of FIG. 1B, the sacrificial layer 115 coats the top surface of layer 116, as well as a first sidewall 114A and second sidewall 114C. The reactive ion etching chemistry may be a known etch chemistry chosen according to the nature of the layer 116, as well as the polymer layer, sacrificial layer 115. For example, if the layer 116 is an SiON layer, the etch chemistry may be chosen to selectively etch SiON with respect to other materials, such as a substrate base layer 118. The etch operation involves forming a plasma 142 and directing an angled reactive ion beam 150 at a non-zero angle of incidence (θ) with respect to the perpendicular 134 to the plane of the substrate 130, which plane may represent an upper main surface of a wafer. Suitable reactive species 152 may be present in a reactive ambient and may accompany the angled reactive ion beam 150, as in known reactive ion beam etching recipes. In some embodiments, the etch operation may be performed in the same apparatus and same chambers as the deposition operation of FIG. 1A, wherein the angled reactive ion beam 150 is extracted from the plasma 142 through the extraction aperture 128, between extraction part 126 and extraction part 124. As shown in FIG. 1E, the extraction aperture 128 may be elongated along the X-direction, such that the size along the X-direction is 3 times, 5 times, 10 times, 20 times, or 50 times the size along the Y-direction in different non-limiting embodiments.

In some non-limiting embodiments, the value of this angle of incidence may range between 15 degrees and 75 degrees. As such, both horizontal surfaces and vertical surfaces may exposed to ions and may be etched. Since there is now a protective polymer (sacrificial layer 115) disposed on the top surface 125 of the layer 116, this etching results in reduced thickness loss of the layer 116 (or reduced vertical etching of the layer 116) as the pattern is elongated. Given that there is also some polymer deposition on the sidewalls, there may also be a reduced lateral etching rate.

Figure 1H:
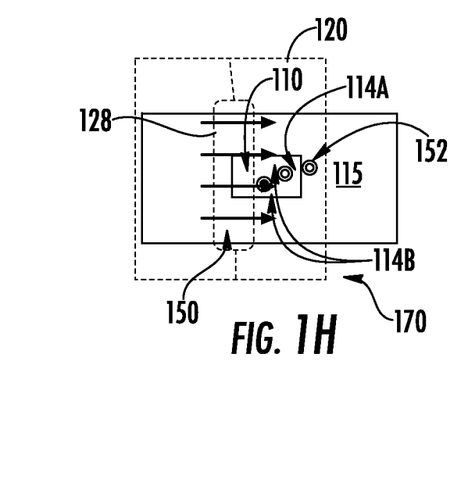

Turning to FIG. 1C and FIG. 1H, there is shown the structure of the substrate 100 at a further stage of the etch operation of FIG. 1B. At this stage, material has been removed from the top surface of sacrificial layer 115 along horizontal surfaces, while the sacrificial layer 115 has been completely removed from the first sidewall 114A, by the angled reactive ion beam 150.

Figure 1I:
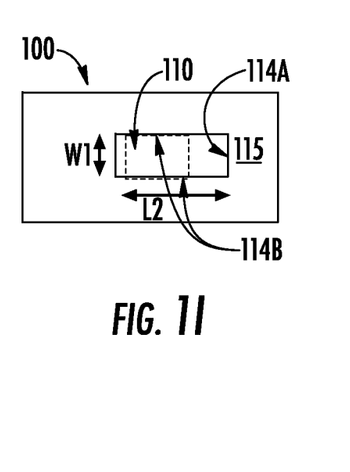

Turning to FIG. 1D and FIG. 1I, there is shown the structure of the substrate 100 at a further stage of the etch operation of FIG. 1C (with angled reactive ion beam 150 removed for clarity). At this stage, more material has been removed from the top surface of layer sacrificial 115, while the sacrificial layer 115 has been completely removed from the first sidewall 114A, by the angled reactive ion beam 150. As shown, the corners of the sacrificial layer 115 may be rounded due to the etching of the angled ions, while the layer 116 remains protected on the top surface. The cavity 110 has been elongated by etching a portion of the first sidewall 114A along the Y-axis to a length L2, while the width of the cavity 110 remains at the value of W1, and the thickness of the layer 116 remains at H1.

Figure 1J:
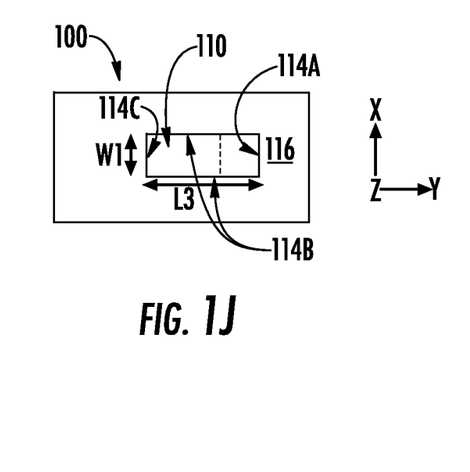

Turning to FIG. 1E and FIG. 1J, there is shown the structure of the substrate 100 after the completion of the etch operation of FIG. 1D. The cavity 110 has been elongated along the Y-axis to a length L3, while the width of the cavity 110 remains at the value of W1, and the thickness of the layer 116 remains at H1. More particularly, at the stage of FIG. 1E, the cavity 110 has been further elongated by the etching the first sidewall 114A by the angled reactive ion beam 150. Subsequently, at the completion of etching using angled reactive ion beam 150, a portion of sacrificial layer 115 may remain, which remnant may be removed by an appropriate wet etch or dry etch, designed to preferentially etch a polymer material with respect to material of layer 116, for example. As such, after removal of the polymer layer, the corners of the cavity 110 may exhibit less rounding than would otherwise occur without the use of the sacrificial layer 115.

Figure 2A:
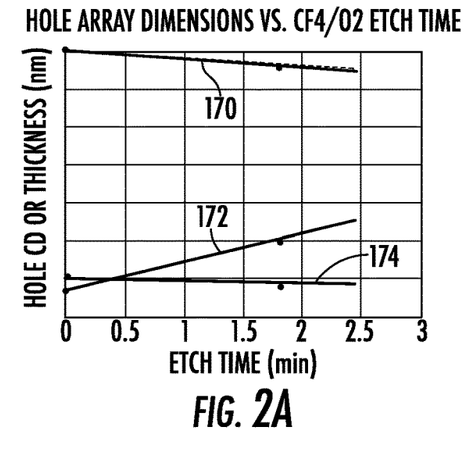
FIG. 2A shows experimental results of selective elongation of a cavity according to some embodiments of the disclosure.

As shown in the above example, the present approach facilitates etching of a structure such as cavity 110 in a manner where the cavity is enlarged along just one direction, while the thickness of a layer containing the cavity may be preserved. Depending upon the exact amount of polymer deposited in the operation of FIG. 1A and the duration of the etching operation of FIG. 1B, the degree of unidirectional etching may be adjusted. Turning to FIG. 2A, there is shown the relative change of dimensions of a cavity as a function of etch time in $CF_4/O_2$ plasma-based 1 kV ion beam, where the ion beam forms angled ions as described above, and in accordance with the present embodiments. The dimensions are for a cavity in an array of cavities formed in an insulating layer on a substrate, where the cavities have an initial lateral dimension on the order of 25 nm, formed within a layer having an initial thickness on the order of 50 nm. In this example, before etching, a polymer layer is deposited before the etching process. The polymer layer is deposited on the cavities from a plasma generated by $CH_3F$, where zero bias is applied between the substrate and plasma chamber. The polymer layer has slightly greater than 10 nm thickness (in the Z-direction) on horizontal surfaces on the array of cavities, while the width of polymer deposited on the sidewalls was approximately one half the thickness of the polymer layer on horizontal surfaces. Thus, the initial cavity width and length was reduced before etching. The curve 170 represents thickness H of the original layer containing the cavity, the curve 172 represents the length along the Y-axis, and the curve 174 represents the width along the Z-axis. In this example, the length L of the cavity is increased by approximately 25% after an etch time of 1.8 min, while the width W does not increase at all. The total thickness loss in H is less than 10 nm. The polymer layer was consumed at the end of etching, as well as a few nm of the original layer containing the cavities.

Figure 2B:
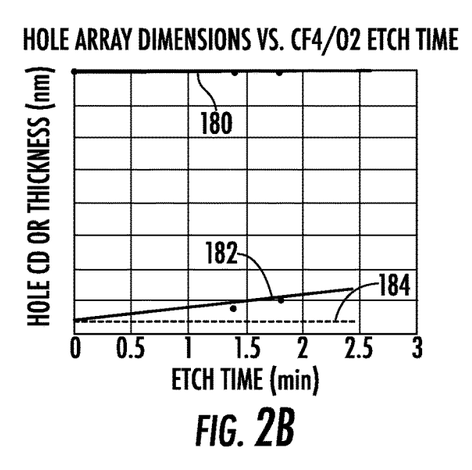
FIG. 2B shows further experimental results of selective elongation of a cavity according to other embodiments of the disclosure.

FIG. 2B presents data for etching of an array of cavities having similar dimensions as in the example of FIG. 2A. In this example, the curve 180 represents thickness H of the original layer containing the cavity, the curve 182 represents the length along the Y-axis, and the curve 184 represents the width along the Z-axis. Before etching a polymer layer of slightly more than 15 nm is deposited on the array of cavities. The deposition of the extra thickness of polymer results in effectively no loss in thickness of the original layer after etching for 1.8 min. Similarly, no change in width W is observed, while the length L is increased by approximately 20%.

The results of FIG. 2A and FIG. 2B illustrate that a combination of deposition and angled reactive ion beam etching may be tuned to optimize unidirectional etching. Notably, the present inventors have observed that when a polymer layer is not deposited on a cavity and a selective elongation etch is performed along a given direction, as in FIG. 1B, unidirectional etching ceases after an initial period. Said differently, while etching may initially proceed just along the Y-axis, after an induction period, such as a few minutes, etching proceeds along the X-axis also, leading to unwanted enlargement of a cavity in the direction orthogonal to the designed enlargement direction. How long the initial period is may depend on the film stack being etched and etch chemistry used.

Figure 2C:
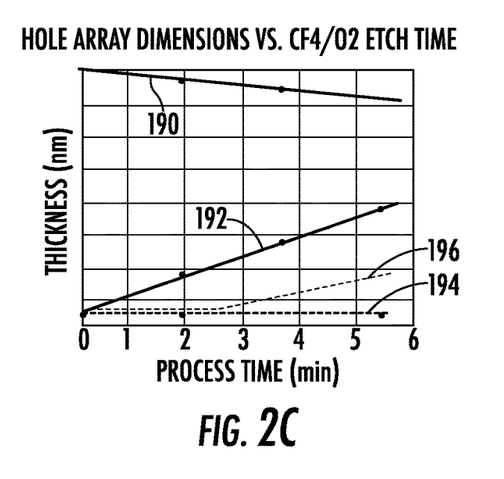
FIG. 2C shows further experimental results of selective elongation of a cavity according to other embodiments of the disclosure.

To account for this phenomenon, the operations of FIG. 1A and FIG. 1B may be repeated in cyclical fashion in a manner that replenishes a polymer coating on a cavity before orthogonal etching of a cavity begins. FIG. 2C presents data showing the relative change of dimensions of a cavity as a function of etch time in $CF_4/O_2$ plasma-based ion beam using angled ions in accordance with further embodiments. In this case, the initial cavity conditions are the same as in the example of FIG. 2A, where a first polymer layer of slightly greater than 10 nm thickness (in the Z-direction) is deposited on the cavity before etching. Notably, after approximately 1.8 min etch duration, a second polymer layer is deposited of similar thickness, followed by a second etch or approximately 1.8 min duration. Subsequently, a third polymer deposition is performed to form a polymer layer of similar thickness as in the other depositions, and a third etch is performed for another 1.8 minutes. As shown, the curve 190 represents thickness H of the original layer containing the cavity, the curve 192 represents the length along the Y-axis, and the curve 194 represents the width along the Z-axis. In this example, the length L of the cavity is increased by approximately 70% after an etch time of 1.8 min, while the width W does not increase at all. The total thickness loss in H is less than 10%. Because the operations were performed in cyclical fashion of 3 cycles, etching was halted in each cycle before orthogonal etching commenced (along the X-axis). Thus, after a total of 5.4 min etching, no orthogonal etching was observed, meaning the cavities were not enlarged along the X-axis. In various experiments, cavity elongation up to 16 nm was observed; however, the results of FIG. 2C may be extended to generate greater elongation by simply performing more cycles. Similarly, as reflected in FIG. 2B, by adjusting the polymer deposition process, and choosing the proper etch time, in principle a unidirectional etch may be realized where the Y-axis is elongated without any loss in thickness of the layer containing the cavity, and no elongation of the cavity along the X-axis. By way of comparison, when directional etching is performed using an ion beam as generally shown in FIG. 1B, without prior deposition of a thin polymer layer, orthogonal etching commences after an initial etch period. Curve 196 illustrates the change in width of cavities along the X-axis as a function of etch time for an etch performed on cavities generally arranged as in the other data of FIG. 2C, under the condition where not polymer layer is deposited before etching. As shown in curve 196, in the initial two minutes, the width along the X-axis does not change, while after 2.5 minutes, the width increases with increasing etch time. Thus, absent the deposition of a thin polymer layer, unidirectional etching is not preserved beyond an initial period of etching.

Figures 3A, 3B:
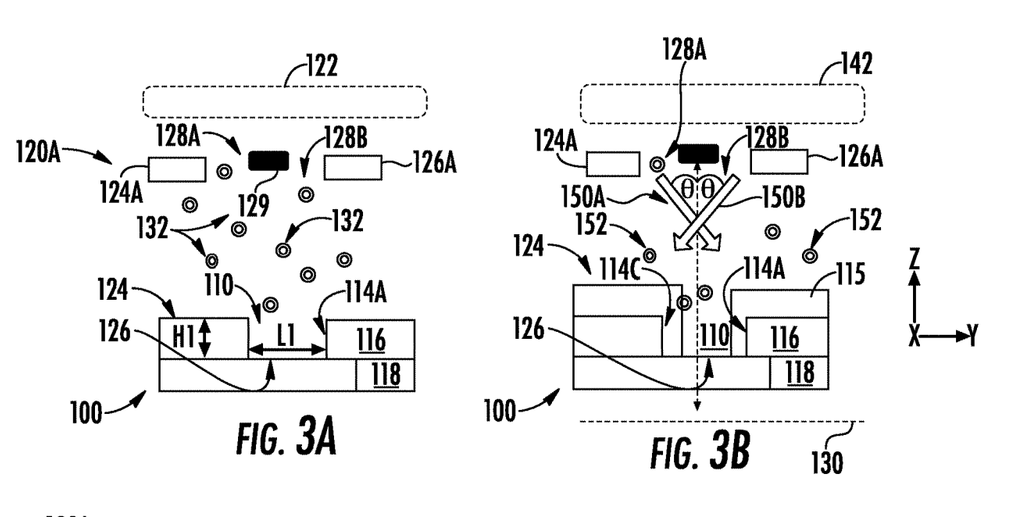
FIG. 3A to FIG. 3E depict a side view of various stages of processing of a substrate, in accordance with other embodiments of the disclosure.
Figures 3C, 3D:
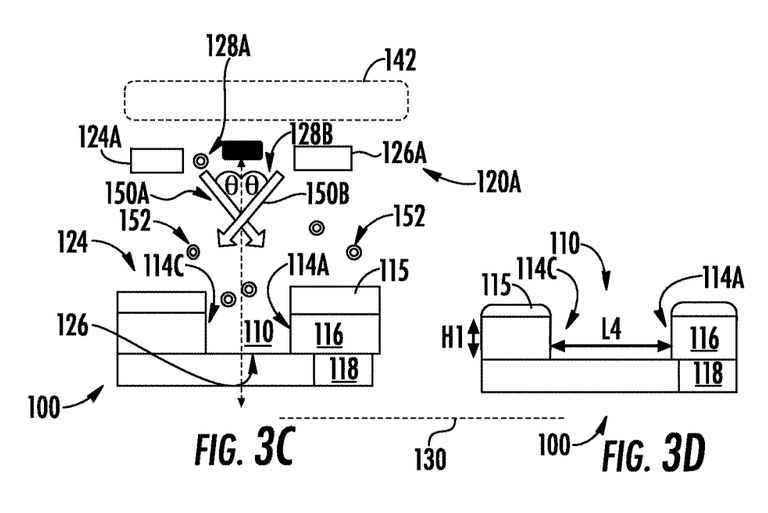
Figure 3E:
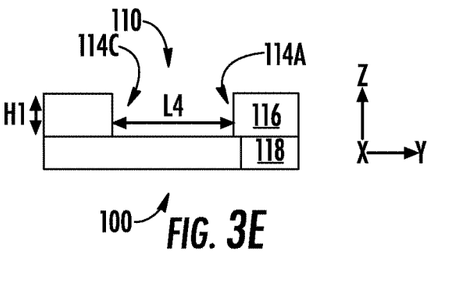

FIG. 3A to FIG. 3E depict a side view of various stages of processing of a substrate, in accordance with embodiments of the disclosure. FIG. 3F to FIG. 3J depict a top view of the stages of corresponding to respective FIGS. 3A to 3E. The operations in FIGS. 3A to 3J is generally similar to those shown in FIGS. 1A-1J, with one difference being the provision of angled reactive ion beam 150A along a first trajectory, and angled reactive ion beam 150B along a second trajectory, opposite the first trajectory. This configuration may be accomplished by providing a beam blocker 129 to define a first extraction aperture 128A and a second extraction aperture 128B, to define two angled ribbon ion beams. These ribbon beams may strike opposite surfaces of the cavity, shown as first sidewall 114A, second sidewall 114C, so that polymer is removed from both sidewalls equally, and the cavity is elongated symmetrically, as shown in FIG. 3E and 3J.

Figure 3F:
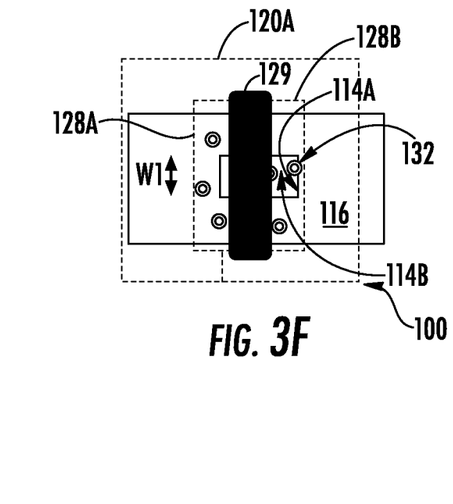
FIG. 3F to FIG. 3J depict a top view of the stages of corresponding to respective FIGS. 3A to 3E.

In FIG. 3A and FIG. 3F, an extraction system 120A is shown, to direct depositing species, as well as etching species to the substrate 100. The extraction system 120A may be implemented in a plasma-based tool in some embodiments. In other embodiments, the extraction system 120A may be omitted. As shown in FIG. 3A, a plasma 122 is generated. The plasma 122 may generate depositing species to deposit a polymer-type film in some embodiments, Gaseous species such as $CH_3F$ or $CH_4$ or other known polymer forming chemical species may be provided, reacted in the plasma 122, exiting the extraction system 120A through extraction aperture 128A and extraction aperture 128B. These species may form reactive depositing species 132, which species impinge upon the substrate 100. In this example, the cavity 110 is formed in a layer 116, where the layer 116 may be a hard mask layer, a soft mask layer, or a device layer, to be preserved. As such, the cavity 110 may be defined by dimensions along different directions, including L1 along the Y-axis, H1 along the Z-axis, and W1 along the X-axis of the Cartesian coordinate system shown.

Figure 3G:
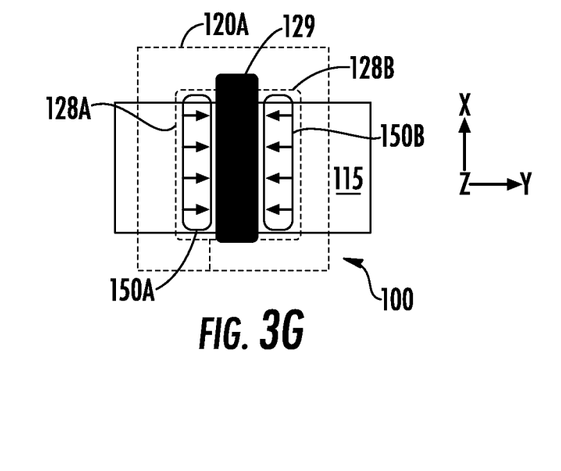

The reactive depositing species may deposit on the layer 116 including on first sidewalls 114A and second sidewalls 114C of the cavity 110, as shown in FIG. 3B and FIG. 3G. In some embodiments, the substrate 100 may be biased negatively with respect to the plasma 122, such as at −200 V, −100 V, −50 V, or −20 V. The embodiments are not limited in this context. As such, a polymeric layer may tend to deposit on the substrate 100, forming the sacrificial layer 115, shown in FIG. 3B and FIG. 3G. The deposition process advantageously may deposit a thicker polymer at the top horizontal surfaces than on the vertical surfaces (sidewalls) or down into the cavity 110, due to the higher solid angle for the flux of radical and neutral species (represented by reactive depositing species 132) coming from the plasma 122.

Continuing with FIG. 3B and FIG. 3G, a directional reactive ion etch operation is performed after the completion of the deposition of the sacrificial layer 115, to elongate the cavity along the Y-axis. At the stage of FIG. 3B, the sacrificial layer 115 coats the top surface of layer 116, as well as a first sidewall 114A and second sidewall 114C. The reactive ion etching chemistry may be a known etch chemistry chosen according to the nature of the layer 116, as well as the polymer layer, sacrificial layer 115. For example, if the layer 116 is an SiON layer, the etch chemistry may be chosen to selectively etch SiON with respect to other materials, such as a substrate base layer 118. The etch operation involves directing a pair of an angled reactive ion beams at a non-zero angle of incidence (θ) with respect to the perpendicular to the plane of the substrate 130, which plane may represent an upper main surface of a wafer. These angled reactive ion beams are shown as angled reactive ion beam 150A, directed along a first trajectory, and angled reactive ion beam 150B, directed along a second trajectory. As noted, this configuration may be accomplished by providing a beam blocker to define a first aperture and a second aperture, shown as extraction aperture 12A and extraction aperture 128B, to define two angled ribbon ion beams.

Suitable reactive species 152 may accompany the angled reactive ion beams, as in known reactive ion beam etching recipes. In some embodiments, the etch operation may be performed in the same apparatus and same chambers as the deposition operation of FIG. 3A, wherein the angled reactive ion beam 150A and angled reactive ion beam 150B are extracted through the extraction aperture 128A, and extraction aperture 128B, lying between extraction part 126A and extraction part 124A. As shown in FIG. 3G, the extraction aperture 128A and extraction aperture 128B may be elongated along the X-direction, such that the size along the X-direction is 3 times, 5 times, 10 times, 20 times, or 50 times the size along the Y-direction in different non-limiting embodiments.

In some non-limiting embodiments, the value of the angles of incidence of angled ions 152A and angled ions 152B may range between 15 degrees and 75 degrees. As such, both horizontal surfaces and vertical surfaces may exposed to ions and may be etched. Since there is now a protective polymer (sacrificial layer 115) disposed on the top surface 125 of the layer 116, this etching results in reduced thickness loss of the layer 116 (or reduced vertical etching of the layer 116) as the pattern is elongated. Given that there is also some polymer deposition on the sidewalls, there may also be a reduced lateral etching rate.

Figure 3H:
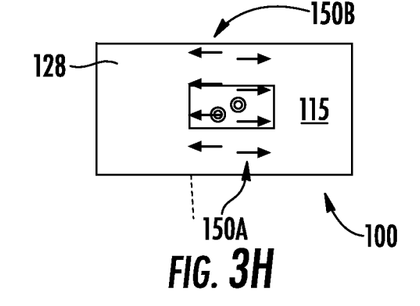

Turning to FIG. 3C and FIG. 3H, there is shown the structure of the substrate 100 at a further stage of the etch operation of FIG. 3B. At this stage, material has been removed from the top surface of sacrificial layer 115, while the sacrificial layer 115 has been completely removed from the first sidewall 114A, by the angled reactive ion beam 150A, and the sacrificial layer 115 has been completely removed from the second sidewall 114C, by the angled reactive ion beam 150B. The sacrificial layer 115 still remains along the top of layer 116.

Figure 3I:
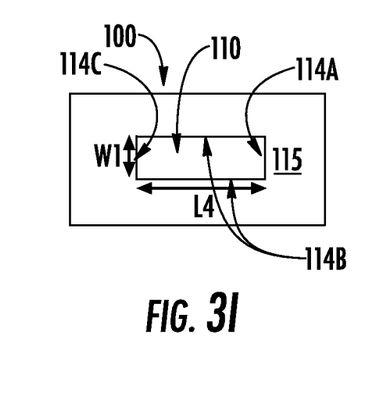
Figure 3J:
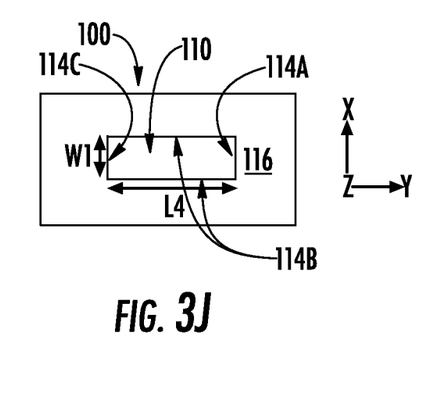

Turning to FIG. 3D and FIG. 3I, there is shown the structure of the substrate 100 at a further stage of the etch operation of FIG. 3C (with angled reactive ion beam 150A and angled reactive ion beam 150B removed for clarity). At this stage, more material has been removed from the top surface of sacrificial layer 115, while the first sidewall 114A and second sidewall 114C have been elongated to generate a length L4 of cavity 110, greater than L1. As shown, the corners of the sacrificial layer 115 may be rounded due to the etching of the angled ions, while the layer 116 remains protected on the top surface. The cavity 110 has been elongated while the width of the cavity 110 remains at the value of W1, and the thickness of the layer 116 remains at H1. Notably, the structure of FIG. 3D may represent the cavity 110 after completion of etching using angled reactive ion beam 150A and angled reactive ion beam 150B.

Turning to FIG. 3E and FIG. 3J, there is shown the structure of the substrate 100 after removal of the sacrificial layer 115 by an appropriate wet etch or dry etch, designed to preferentially etch a polymer material with respect to material of layer 116, for example. As such, after removal of the polymer layer, the corners of the cavity 110 may exhibit less rounding than would otherwise occur without the use of the sacrificial layer 115.

Figure 4A:
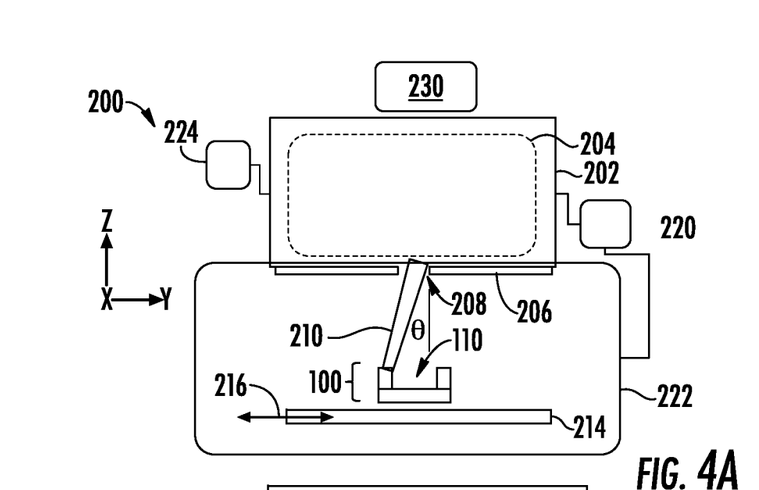
FIG. 4A shows a block view of another processing apparatus according to further embodiments of the disclosure.

Turning now to FIG. 4A, there is shown a processing apparatus 200, depicted in schematic form. The processing apparatus 200 represents a processing apparatus for selectively etching portions of a substrate, such as selectively elongating a cavity. The processing apparatus 200 may be a plasma-based processing system having a plasma chamber 202 for generating a plasma 204 therein by any convenient method as known in the art. A power supply 230, may, for example, be an RF power supply to generate the plasma 204. An extraction plate 206 may be provided as shown, having an extraction aperture 208, where a selective etching may be performed to selectively remove sidewall layers. A substrate, such as a substrate 100 having the aforementioned structure as shown at FIG. 1B, is disposed in the process chamber 222. A substrate plane of the substrate 100 is represented by the X-Y plane of the Cartesian coordinate system shown, while a perpendicular to the plane of the substrate 100 lies along the Z-axis (Z-direction).

During a directional etching operation, an angled ion beam 210 is extracted through the extraction aperture 208 as shown. In one embodiment, the angled ion beam 210 may represent angled reactive ion beam 150, described above. The angled ion beam 210 may be extracted when a voltage difference is applied using bias supply 220 between the plasma chamber 202 and substrate 100 as in known systems. The bias supply 220 may be coupled to the process chamber 222, for example, where the process chamber 222 and substrate 100 are held at the same potential. In various embodiments, the angled ion beam 210 may be extracted as a continuous beam or as a pulsed ion beam as in known systems. For example, the bias supply 220 may be configured to supply a voltage difference between plasma chamber 202 and process chamber 222, as a pulsed DC voltage, where the voltage, pulse frequency, and duty cycle of the pulsed voltage may be independently adjusted from one another.

Figure 4B:
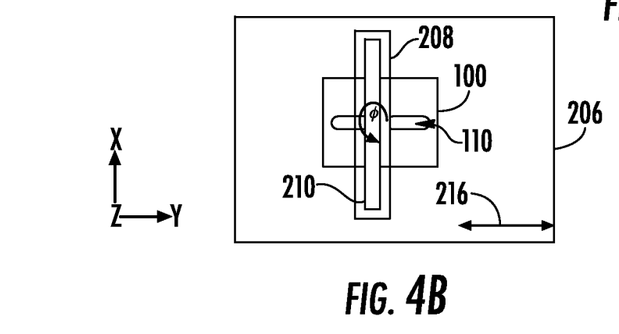
FIG. 4B illustrates a top plan view of an extraction geometry of the processing apparatus of FIG. 3A, according to further embodiments of the disclosure.

By scanning a substrate stage 214 including substrate 100 with respect to the extraction aperture 208, and thus with respect to the angled ion beam 210, along the scan direction 216, the angled ion beam 210 may etch targeted surfaces of structures, such as the cavities 110*un*, when such structures are oriented, for example, perpendicularly to the scan direction 216, as further shown in FIG. 4B. In various embodiments, for example, the angled ion beam 210 may be provided as a ribbon ion beam having a long axis extending along the X-direction of the Cartesian coordinate system shown in FIG. 4B. The substrate 100 may be arranged, for example, where one set of sidewalls (see first sidewalls 114A) of the cavities 110 is exposed to the angled ion beam 210. In this manner, as shown in FIG. 4A, the angled ion beam 210, forming a non-zero angle of incidence with respect to the Z-axis (normal to the substrate plane), may strike the sidewalls oriented along the X-Z plane, as noted. This geometry facilitates reactive ion etching of the X-Z sidewalls, while not etching the Y-Z sidewalls, and thus selectively elongates the cavities 110 to generate the elongated structure of cavities 110, as shown in FIG. 1C or FIG. 1F. In various embodiments, the value of the non-zero angle of incidence may vary from 10 degrees to 75 degrees, while in some embodiments the value may range between 20 degrees and 60 degrees. The embodiments are not limited in this context. The angled ion beam 210 may be composed of any convenient gas mixture, including inert gas, reactive gas, and may be provided in conjunction with other gaseous species in some embodiments. Gas may be provided from a gas source 224, where the gas source 224 may be a gas manifold coupled to provide a plurality of different gases to the plasma chamber 202. In particular embodiments, the angled ion beam 210 and other reactive species may be provided as an etch recipe to the substrate 100 so as to perform a directed reactive ion etching of targeted sidewalls of patterning layers on substrate 100. As discussed above, the etch recipe may be selective with respect to the material of the substrate base layer 118, so as to remove material of the polymer layer (sacrificial layer 115) and the layer 116, while not etching the substrate base layer 118, or etching the substrate base layer 118 to a lesser extent.

In the example of FIG. 4B, the angled ion beam 210 is provided as a ribbon ion beam extending to a beam width along the X-direction, where the beam width is adequate to expose an entire width of the substrate 100, even at the widest part along the X-direction. Exemplary beam widths may be in the range of 10 cm, 20 cm, 30 cm, or more while exemplary beam lengths along the Y-direction may be in the range of 3 mm, 5 mm, 10 mm, or 20 mm. The embodiments are not limited in this context.

As also indicated in FIG. 4B, the substrate 100 may be scanned in the scan direction 216, where the scan direction 216 lies in the X-Y plane, such as along the Y-direction. Notably, the scan direction 216 may represent the scanning of substrate 100 in two opposing (180 degrees) directions along the Y-direction, or just a scan toward the left or a scan toward the right. As shown in FIG. 3B, the long axis of angled ion beam 210 extends along the X-direction, perpendicularly to the scan direction 216. Accordingly, an entirety of the substrate 100 may be exposed to the angled ion beam 210 when scanning of the substrate 100 takes place along a scan direction 216 to an adequate length from a left side to right side of substrate 100 as shown in FIG. 4B.

Figure 4C:
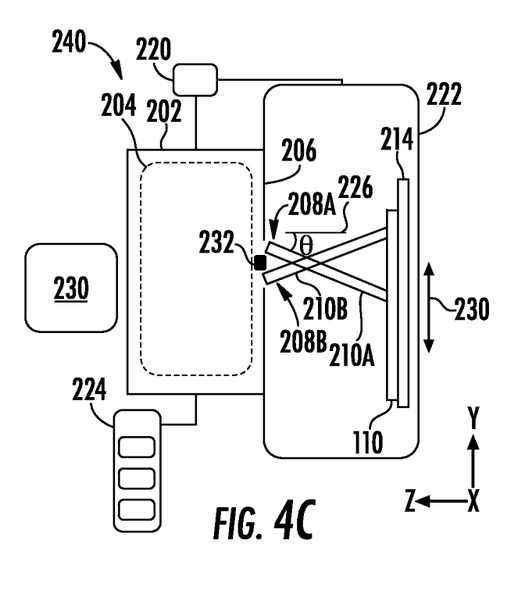
FIG. 4C shows a block view of another processing apparatus according to further embodiments of the disclosure.

Turning now to FIG. 4C, there is shown another processing apparatus 240, depicted in schematic form. The processing apparatus 240 represents a processing apparatus for performing angled ion treatment of a substrate, and may be substantially the same as the processing apparatus 200, save for the differences discussed below. Notably, the processing apparatus 240 includes a beam blocker 232, disposed adjacent the extraction aperture 208. The beam blocker 232 is sized and positioned to define a first aperture 208A and a second aperture 208B, where the first aperture 208A forms a first angled ion beam 210A, and the second aperture 208B forms a second angled ion beam 210B. The two angled ion beams may define angles of incidence with respect to the perpendicular 226, equal in magnitude, opposite in direction. In one embodiment, the first angled ion beam 210A may represent angled reactive ion beam 150A, while the second angled ion beam 210B represents angled reactive ion beam 150. The beam blocker offset along the Z-axis with respect to extraction plate 206 may help define the angle of the angled ion beams. As such, the first angled ion beam 210A and the second angled ion beam 210B may treat opposing sidewalls of a semiconductor fin similarly and simultaneously, as generally depicted in FIG. 4C. When configured in the shape of a ribbon beam as in FIG. 4B, these angled ion beams may expose an entirety of the substrate 100 to reactive ion etching of the cavities 110 distributed in devices across the substrate 100, by scanning the substrate platen 214 as shown. In this configuration opposite sidewalls of the cavities 110 may be etched simultaneously, elongating the cavities 110 in two opposite directions along the Y-axis in one scan operation.

In accordance with various embodiments of the disclosure, the processing apparatus 200 or processing apparatus 240 may also be arranged to deposit a polymer film, as detailed above. Thus, before an etch operation is commenced, an appropriate species, such as Ch3F may be provided to the plasma chamber to deposit a polymer layer on the substrate 100. After deposition, gas chemistry may be switched to perform reactive angled ion beam etching using the angled ion beam 210 or angled ion beams (210A, 210B) as the case may be.

Figure 5:
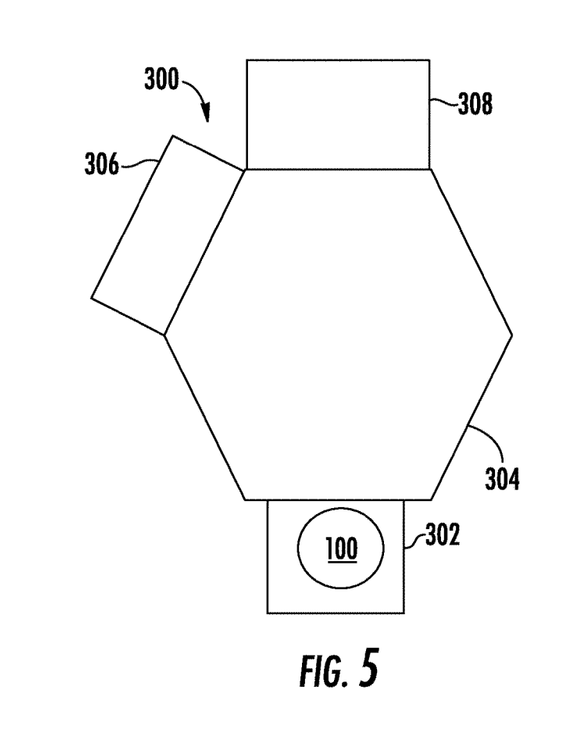
FIG. 5 illustrates another processing apparatus according to additional embodiments of the disclosure.

In other embodiments, the deposition and etch operations detailed above may be performed in separate stations of a cluster tool. FIG. 5 presents a top plan view (X-Y plane) of an exemplary system, shown as system 300, according to embodiments of the disclosure. The system 300 may be used for performing the angled ion etch operations, as well as normal-incidence etch operations in accordance with the embodiments disclosed herein. The system 300 may be configured as a cluster tool, including a loadlock 302 and transfer chamber 304 to transport a substrate 100 to and between various processing chambers. The transfer chamber 304 and processing chambers may be coupled to evacuation apparatus such as known pumping systems (not shown) for maintaining the transfer chamber 304 and other processing chambers, discussed below, under vacuum conditions, or under controlled ambient conditions. Accordingly, the substrate 100 may be transported between the various processing chambers and transfer chamber 304 without exposure to ambient. The system 300 may include an angled ion beam etch station 306, coupled to the transfer chamber 304, where the substrate 100 is exposed to ions directed at a non-zero angle of incidence with respect to a normal to a substrate plane, consistent with the geometry generally shown in FIGS. 1A-1C or 3A-3C. The angled ion beam etch station 306 may constitute a plasma chamber and extraction plate, as generally described above, or may constitute plasma chamber, extraction plate, as well as process chamber, described above. The system 300 may further include a polymer deposition chamber 308, coupled to the transfer chamber 304, and arranged to perform deposition of a thin polymer layer. As such, to perform the sequence of operations shown in FIG. 1A-1E, the substrate 100 may be transported in sequence between angled ion beam etch station 306, and polymer deposition chamber 308, while vacuum is not broken between operations. An advantage of the configuration of FIG. 5 is that the process of FIGS. 1A-1E may be may be repeated in cycles to preserve unidirectional etching by periodically replenishing thin polymer layers on cavities 110, while not having to change chemistry in a given chamber, since the same process may be repeated in a given dedicated chamber. The ability to rapidly replenish a sacrificial polymer layer on a cavity being etched in a directional ion beam chamber allows etching of the main layer to be etched, such as layer 116, to proceed along just one direction, while the top of the layer 116 experiences no etching, due to the repeated replenishment of polymer layer. This repeated replenishment also may prevent or minimize any corner rounding experienced by the layer 116, for example.

Figure 6:
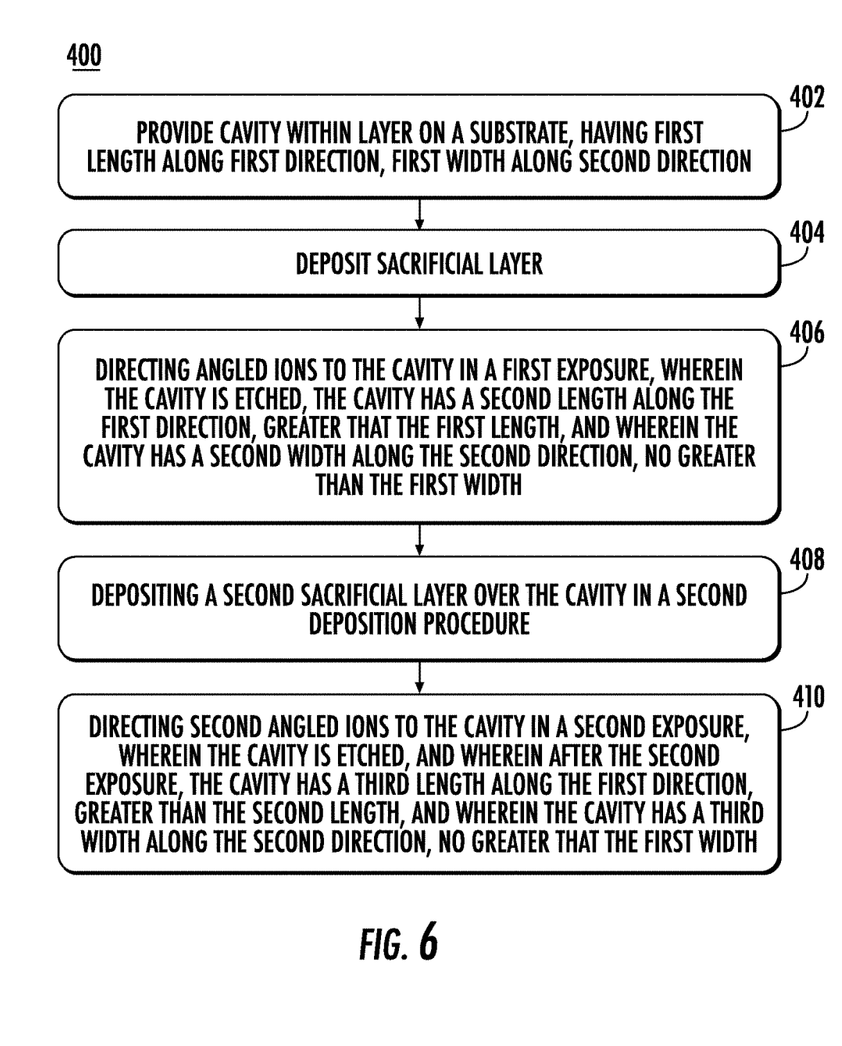
FIG. 6 depicts an exemplary process flow, according to one embodiment.

FIG. 6 depicts an exemplary process flow 400. At block 402, a cavity is provided within at least one layer, disposed on a substrate. The cavity may be formed within a given layer in some embodiments. In some embodiments, the cavity may be characterized by a first length along a first direction and a first width along a second direction, perpendicular to the first direction. The layer may be characterized by a first height. At block 404 a sacrificial layer is deposited. The sacrificial layer may be a thin polymer layer in some embodiments. The sacrificial layer may be deposited so as to form a thicker layer on horizontal surfaces above the cavity, and a relatively thinner layer on vertical surfaces of the cavity.

At block 406, the cavity is exposed to angled ions, such as in a reactive ion etch operation where the cavity is elongated along the first direction to a second length while the cavity has a second width along the second direction, no greater than the first width.

At block 408 a second sacrificial layer is deposited. The second sacrificial layer may be a thin polymer layer in some embodiments. The second sacrificial layer may be deposited so as to form a thicker layer on horizontal surfaces above the cavity, and a relatively thinner layer on vertical surfaces of the cavity.

At block 410, the cavity is exposed to angled ions, such as in a reactive ion etch operation where the cavity is elongated along the first direction to a third length, greater than the second length, while the cavity has a third width along the second direction, no greater than the first width.

The present embodiments provide various advantages over conventional processing to define features in a substrate. One advantage lies in the ability to selectively elongate a cavity along just one direction, while preserving the dimension of the cavity along a second direction, perpendicular to the first direction. Another advantage is the ability to reduce cavities below the spacing achieved by known lithography processes. An example of this ability is the reduction of tip-to-tip separation between adjacent trenches such as contact trenches. Another advantage provided by the present embodiments is the ability to prevent undue thickness loss of a hardmask and reduce corner rounding in a cavity formed in the hardmask layer, while still selectively elongating the cavity along a targeted direction. A further advantage is the ability to reduce the number of masks used to generate a pattern of features, where the features may be separated by a distance less than the threshold separation achievable by a single mask. This reducing the number of masks has the further advantageous effect of reducing overlay error for printing the pattern of features.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of patterning a substrate, comprising:
   providing a cavity, the cavity comprising a sacrificial layer, and a first layer, subjacent to the sacrificial layer, and disposed on the substrate, the sacrificial layer comprising a relatively greater thickness on an upper surface of the first layer than on a sidewall of the cavity, the cavity having a first length along a first direction, wherein the first layer has a first height along a direction, perpendicular to the first direction; and
   directing angled ions to a sidewall of the cavity in a first exposure, wherein the sidewall of the cavity is etched, wherein after the first exposure, the cavity has a second length along the first direction, greater than the first length, and wherein the sacrificial layer is retained on the upper surface of the first layer after the first exposure.

2. The method of claim 1,
   wherein the first layer retains the first height after the first exposure.

3. The method of claim 2, further comprising:
   depositing a second sacrificial layer over the cavity in a second deposition procedure; and
   directing second angled ions to the cavity in a second exposure, wherein the cavity is etched, and wherein after the second exposure, the cavity has a third length along the first direction, greater than the second length, and wherein the sacrificial layer is retained after the second exposure.

4. The method of claim 1, wherein the angled ions are first angled ions, wherein the first angled ions are directed in a presence of a first reactive ambient, along a first trajectory at a first non-zero angle of incidence with respect to a perpendicular to a plane of the substrate, the first trajectory being aligned with the first direction.

5. The method of claim 1, wherein the angled ions are directed in a presence of a first reactive ambient, wherein the angled ions comprise:
   a first angled ion beam having a first trajectory, at a first non-zero angle of incidence with respect to a perpendicular to a plane of the substrate; and
   a second angled ion beam having a second trajectory, at a second non-zero angle of incidence with respect to a perpendicular to a plane of the substrate, wherein the first trajectory and the second trajectory are aligned with the first direction, and opposite to one another.

6. The method of claim 5, wherein the first angled ion beam and the second angled ion beam comprise a first ribbon beam and a second ribbon beam, respectively.

7. The method of claim 1, wherein the sacrificial layer is formed by:
   generating a plasma in a plasma chamber, including a depositing species; and
   providing an extraction aperture along a side of the plasma chamber, wherein the depositing species diffuse through the extraction aperture to the substrate.

8. The method of claim 7, wherein the directing angled ions to the cavity in the first exposure comprises directing the angled ions through the extraction aperture.

9. A method of patterning a substrate, comprising:
   providing a cavity the cavity comprising a sacrificial layer, and a first layer, subjacent to the sacrificial layer, and disposed on the substrate, the sacrificial layer comprising a relatively greater thickness on an upper surface of the first layer than on a sidewall of the cavity, the cavity having a first length along a first direction, wherein the first layer has a first height along a direction, perpendicular to the first direction; and
   directing angled ions to the cavity in a first exposure, wherein the angled ions comprise:
   a first angled ion beam having a first trajectory, directed to a first sidewall of the cavity; and
   a second angled ion beam having a second trajectory, directed to a second sidewall of the cavity, opposite the first sidewall,
   wherein the first sidewall and the second sidewall of the cavity are etched, wherein after the first exposure, the cavity has a second length along the first direction, greater than the first length, and wherein the sacrificial layer is retained on the upper surface of the first layer after the first exposure.

10. The method of claim 9,
    wherein the first layer retains the first height after the first exposure.

11. The method of claim 9, wherein the first angled ion beam and the second angled ion beam comprise a first ribbon beam and a second ribbon beam, respectively.

12. The method of claim 10, wherein the first layer comprises a hard mask layer, and wherein the sacrificial layer comprises a polymer layer.

13. The method of claim 9, wherein a deposition of the sacrificial layer and the directing the angled ions comprises a first etch cycle, the method comprising repeating the first etch cycle at least once in a plurality of etch cycles, wherein after the plurality of etch cycles, the cavity has a third length along the first direction, greater than the second length, and wherein the sacrificial layer is retained after the second exposure.

14. The method of claim 13, wherein a thickness loss of the first layer after the plurality of etch cycles is less than 10%.

15. The method of claim 9, wherein the first angled ion beam and the second angled ion beam comprise a first ribbon beam and a second ribbon beam, elongated along the second direction.

16. The method of claim 15, further comprising scanning the substrate along the first direction during the first exposure.

* * * * *